(12) United States Patent
Saèd

(10) Patent No.: US 7,295,066 B2
(45) Date of Patent: Nov. 13, 2007

(54) ADAPTIVE PREDISTORTION FOR A TRANSMIT SYSTEM

(75) Inventor: Aryan Saèd, Ottawa (CA)

(73) Assignee: Zarbana Digital Fund LLC, Wilmington, DE (US)

( * ) Notice: Subject to any disclaimer, the term of this patent is extended or adjusted under 35 U.S.C. 154(b) by 0 days.

(21) Appl. No.: 11/401,603

(22) Filed: Apr. 10, 2006

(65) Prior Publication Data
US 2006/0181345 A1 Aug. 17, 2006

Related U.S. Application Data

(60) Division of application No. 10/641,372, filed on Aug. 13, 2003, now Pat. No. 7,026,871, which is a continuation-in-part of application No. 10/613,372, filed on Jul. 3, 2003, now Pat. No. 7,068,101.

(51) Int. Cl.
*H03F 1/26* (2006.01)
(52) U.S. Cl. .................. 330/149; 330/84; 330/107; 330/124 R
(58) Field of Classification Search ............... 330/149, 330/84, 107, 124 R
See application file for complete search history.

(56) References Cited

U.S. PATENT DOCUMENTS

| | | | |
|---|---|---|---|
| 5,880,633 A | 3/1999 | Leizerovich et al. | |
| 6,043,707 A | 3/2000 | Budnik | |
| 6,054,896 A * | 4/2000 | Wright et al. ............... | 330/149 |
| 6,072,364 A | 6/2000 | Jeckeln et al. | |
| 6,208,207 B1 | 3/2001 | Cavers | |
| 6,211,733 B1 | 4/2001 | Gentzler | |
| 6,342,810 B1 | 1/2002 | Wright et al. | |
| 6,388,518 B1 | 5/2002 | Miyatani | |
| 6,940,916 B1 * | 9/2005 | Warner et al. .............. | 375/261 |

(Continued)

FOREIGN PATENT DOCUMENTS

EP 1313278 4/2006

(Continued)

OTHER PUBLICATIONS

Michael Faulkner; "Adaptive Linearization Using Predistortion-Experimental Results"; IEEE Transactions on Vehicular Technology; May 1994; pp. 323-332; vol. 43, No. 2.

*Primary Examiner*—Patricia Nguyen
(74) *Attorney, Agent, or Firm*—Stolowitz Ford Cowger LLP

(57) ABSTRACT

Systems, methods, and devices relating to the provision of deliberate predistortion to an input signal to compensate for distortions introduced by an amplifier subsystem. An input signal is received by a signal processing system which includes a predistortion subsystem. The input signal is decomposed and the fragments are then predistorted by the predistortion subsystem by applying a deliberate predistortion to the fragments. The predistorted fragments are then separately processed and recombined to arrive at the system output signal. The predistortion subsystem adaptively adjusts based on characteristics of the system output signal. Also, the predistortion subsystem is equipped with a control system that is state based—the state of the predistortion subsystem is dependent upon the prevailing conditions and, when required, the control system switches the state of the predistortion subsystem. A feedback signal, a replica of the system output signal, is used in updating lookup table entries used to determine the predistortion.

36 Claims, 7 Drawing Sheets

U.S. PATENT DOCUMENTS

| | | |
|---|---|---|
| 6,985,704 B2 * | 1/2006 | Yang et al. ............... 455/126 |
| 2001/0054974 A1 | 12/2001 | Wright |
| 2002/0034260 A1 | 3/2002 | Kim |
| 2002/0101937 A1 | 8/2002 | Antonio et al. |

FOREIGN PATENT DOCUMENTS

| | | |
|---|---|---|
| WO | 0105026 | 1/2001 |
| WO | 0156146 | 8/2001 |

* cited by examiner

ADAPTIVE PREDISTORTION FOR A TRANSMIT SYSTEM

CROSS-REFERENCE TO RELATED APPLICATIONS

The present application is a divisional of U.S. application Ser. No. 10/641,372 filed Aug. 13, 2003 now U.S. Pat. No. 7,026,871 which in turn is a continuation-in-part of U.S. application Ser. No. 10/613,372 filed Jul. 3, 2003 now U.S. Pat. No. 7,068,101.

FIELD OF THE INVENTION

The present invention relates generally to power amplification systems and is specifically applicable but not limited to power amplification systems using a Chireix architecture.

BACKGROUND TO THE INVENTION

The recent revolution in communications has caused a renewed focus on wireless technology based products. Mobile telephones, handheld computers, and other devices now seamlessly communicate using wireless technology. One component that forms the core of such technology is the amplifier. Wireless devices require high efficiency amplifiers to not only extend the range of their coverage but also to conserve the limited battery power that such devices carry.

One possible architecture which may be used for such a power amplifier is called a Chireix architecture. Named after Henry Chireix who first proposed such an architecture in the 1930s, the Chireix architecture has fallen out of favor due to its seemingly inherent limitations. However, it has recently been revisited as it provides some advantages that other architectures do not have.

While the Chireix architecture provides some advantages, the process which the input signal undergoes also introduces some drawbacks. Specifically, distortions are introduced into the signal by the components in the Chireix based amplifier/modulator system. These distortions may also change over time and may therefore lead to a time-varying "drift" or change in the signal. Such distortions, time-varying or not, have led to problems that are not only inconvenient but expensive as well.

Based on the above, there is therefore a need for an amplifier system which provides the benefits of a Chireix based amplifier but which also compensates for or avoids the distortions which a Chireix based amplifier introduces. Such an amplifier system should adjust to differing conditions, preferably with little or no user intervention. It is therefore an object of the present invention to provide alternatives which mitigate if not overcome the disadvantages of the prior art.

SUMMARY OF THE INVENTION

The present invention provides systems, methods, and devices relating to the provision of deliberate predistortion to an input signal to compensate for distortions introduced by an amplifier subsystem. An input signal is received by a signal processing system which includes a predistortion subsystem. The input signal is decomposed and the fragments are then predistorted by the predistortion subsystem by applying a deliberate predistortion to the fragments. The predistorted fragments are then separately processed and recombined to arrive at the system output signal. The predistortion subsystem adaptively adjusts based on characteristics of the system output signal. Also, the predistortion subsystem is equipped with a control system that is state based—the state of the predistortion subsystem is dependent upon the prevailing conditions and, when required, the control system switches the state of the predistortion subsystem. A feedback signal, a replica of the system output signal, is used in updating lookup table entries used to determine the predistortion.

In a first aspect, the present invention provides a system for processing an input signal, the system comprising:
  a signal processing subsystem receiving and processing said input signal and producing a system output signal,
  an adaptive predistortion subsystem receiving at least two internal input signals and producing at least two predistorted signals by applying a deliberate predistortion to said at least two internal input signals, wherein
  said predistortion subsystem distorts said internal input signals to compensate for distortions in said system output signal;
  said signal processing subsystem decomposes said input signal into separate components to produce said at least two internal input signals, each of said separate components being processed separately;
  said processing subsystem combines said predistorted signals after processing to produce said system output signal; and
  said deliberate predistortion applied to said at least two internal input signals by said adaptive predistortion subsystem to produce said at least two predistorted signals is adjusted based on characteristics of said system output signal and said input signal.

In a second aspect the present invention provides a method of processing an input signal to produce a system output signal, the method comprising:
  a) receiving said input signal;
  b) decomposing said input signal into at least two component signals;
  c) applying a deliberate predistortion to each of said at least two component signals to produce predistorted signals;
  d) combining said predistorted signals to produce said system output signal;
  e) adjusting said deliberate predistortion based on said characteristics of said system output signal.

In a third aspect the present invention provides an adaptive predistortion subsystem for use with a signal processing system which produces a system output signal, the predistortion subsystem comprising:
  determining means for determining a deliberate predistortion to be applied to an input signal;
  adjustment means for applying said deliberate predistortion to said input signal;
  update means for periodically updating said determining means based on characteristics of said system output signal.

In a fourth aspect, the present invention provides a preprogrammed control device for use in controlling an adaptive predistortion subsystem, said device being programmed with a predefined set of states, each state having associated with it a predefined set of commands to be executed by said subsystem when said device is in said state, the device comprising:
  a processor means for receiving and processing data relating to a status of said subsystem;
  first memory means for storing said data; and second memory means for storing preprogrammed settings for said device, wherein
when said device detects one of a set of specific, predetermined conditions, said device switches from one state to another.

BRIEF DESCRIPTION OF THE DRAWINGS

A better understanding of the invention will be obtained by considering the detailed description below, with reference to the following drawings in which:

FIG. 5B is a state diagram illustrating the different states through which the predistortion subsystem of FIG. 4 may pass through;

DETAILED DESCRIPTION

For clarity, the following terms are to be used with the following definitions:

AM (amplitude modulation) refers to the AM of an RF (radio frequency) signal and is equal to the magnitude of the RF signal's complex base band equivalent PM (phase modulation) refers to the PM of an RF signal and is equal to the phase of the RF signal's complex base band equivalent.

Figure 1:
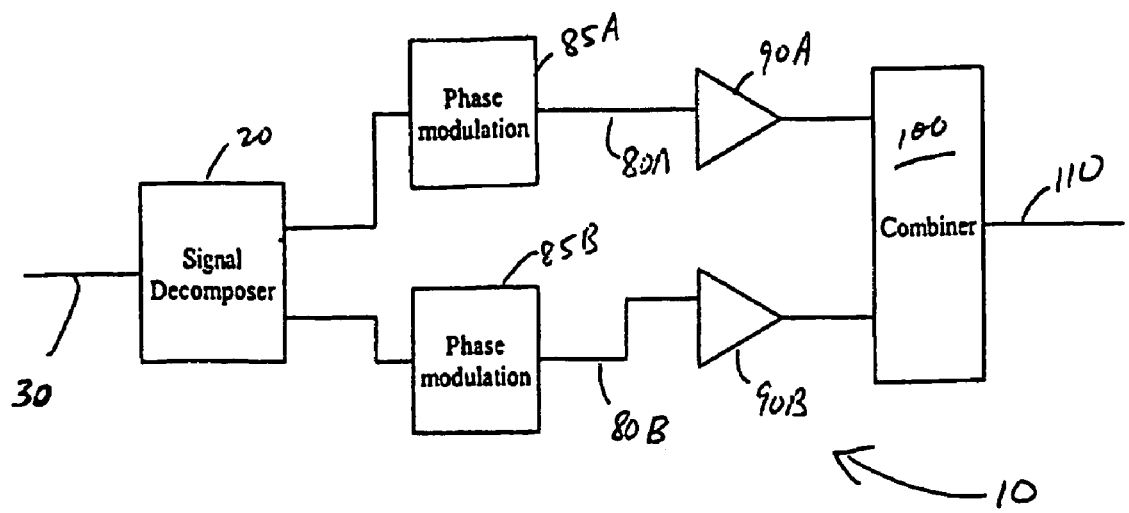
FIG. 1 is a block diagram of a Chireix architecture amplifier subsystem.

Referring to FIG. 1, a block diagram of a Chireix architecture amplifier subsystem 10 is illustrated. A signal decomposer 20 receives an input complex baseband signal 30. Phase modulated RF signals 80A, 80B are produced after the decomposed output of the decomposer 20 are phase modulated by phase modulation circuitry 85A, 85B. These phase modulated signals 80A, 80B are received by power amplifiers 90A, 90B. The phase modulated signals are thus amplified by the power amplifiers 90A, 90B and are received by a signal combiner 100. The system output signal 110 (an RF signal corresponding to the input baseband signal 30) is output from the combiner 100 and is an amplified and modulated version of the input signal 30. Phase modulation of the phase modulated signals 80A, 80B is executed after the signal decomposer 20 separates input signal 30 into at least two components. These at least two components, after phase modulation, are the signals 80A, 80B.

As noted above, the Chireix architecture has been known to introduce distortions in the system output signal 110. Part of these distortions result from he decomposition and subsequent recombining of these components. The phase fragmentation circuitry in the decomposer 20 translates a complex signal sample $x(k)=M(k) \exp(j\vartheta(k))$ to samples of a pair of phase signals $\alpha(k)$ and $\beta(k)$. The individual phase signals are then translated into the complex signals a(k) and b(k):

$$a(k)=\exp(j\alpha(k))/2$$

$$b(k)=\exp(j\beta(k))/2$$

For each of the complex signals a(k) and b(k), the real part of the signal is mapped to the RF (radio frequency) in-phase channel and the imaginary part of the signal is mapped to the RF quadrature channel. For ease of reference and for use in later sections of this document, it should be noted that the expression $\exp(j\alpha(k))$ is termed a phasor and that the $\alpha(k)$ alone is termed a phase angle. When the complex variable $\exp(j\alpha(k))$ is represented by a pair of variables representing the real and imaginary parts, this will be termed a vector and will be denoted by $\bar{a}(k)$.

Both signals a(k) and b(k), each having constant magnitude, are summed (by means of RF power amplification circuitry) by the combiner 100 to produce the system output signal 110. It should be noted that the factor ½ in both expressions a(k) and b(k) is a scaling factor which limits their sum to less than or equal to one (i.e. $a(k)+b(k) \leq 1$) on the assumption that $x(k) \leq 1$.

Two types of distinct decomposition and combination calculations may be used to relate the phase signals $\alpha(k)$ and $\beta(k)$ to the complex signal x(k). For brevity, we denote $x=M* \exp(j\vartheta)$ and the sampled RF base band equivalent of the system output signal is denoted as c(k) which corresponds to x(k) such that c(k)=x(k) if there are no impairments in the system.

The first type of decomposition is termed Magnitude Linear (ML) Decomposition and it is defined by the following equations:

$$\text{Define } \phi = \cos^{-1}(M), \text{ then } \alpha = \vartheta - \phi \text{ and } \beta = \vartheta + \phi$$

$$ML \text{ Combination: } c = \frac{\exp(j\alpha) + \exp(j\beta)}{2}$$

Using trigonometric identities, it can be shown that |c|=M and $\angle c=\vartheta$ as desired. Also, since $M=\cos(\phi)$, the difference angle $$\phi = \frac{\beta - \alpha}{2},$$

corresponds to the magnitude of the signal and the sum angle $$\vartheta = \frac{\alpha + \beta}{2}$$

corresponds to the phase of the signal. For convenience, we define a phasor fragment opening angle $\Phi=2\phi$.

The second type of decomposition is termed Phase-Linear (PL) Decomposition. The Phase-Linear combination embeds a level of predistortion in the phasor fragmentation that is suitable for a combiner that provides an output magnitude that is substantially proportional to the opening angle, as opposed to a combiner that provides an output magnitude that is substantially proportional to the cosine of the opening angle. Such phasor fragmentation relieves the predistortion circuitry from linearizing the distortion effects due to the lack of the cosine characteristic in the combiner. It is believed that power amplifiers and combiners with such phase-linear characteristics have better power efficiency than those without such characteristics. Phase Linear Decomposition is defined by the following:

$$PL\text{-Decomposition } \phi' = \frac{\pi}{2}(1-M), \text{ then } \alpha = \vartheta - \phi', \beta = \vartheta + \phi'$$

$$PL\text{-Combination } |c| = 1 - \frac{2\phi'}{\pi} \text{ and } \angle c = \vartheta.$$

Similar to the ML Decomposition, the phasor fragment opening angle is defined as $\Phi = 2\phi'$.

Figure 2A:
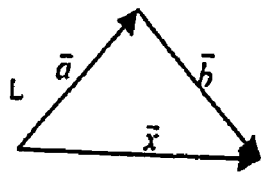
FIGS. 2A and 2B illustrate how a vector can be decomposed in two different but similar manners.
Figure 2B:
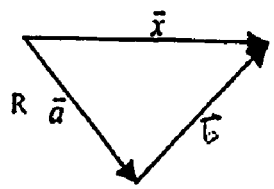

As a further refinement of the above decompositions, it should be noted that there are two possibilities for each decomposition. As is well-known, a complex number can be represented by a vector and, as shown in FIGS. 2A and 2B, this vector can be decomposed in two ways. Both FIGS. 2A and 2B illustrate how a vector $\bar{x}$ can be decomposed as the sum of two equal length vectors $\bar{a}$ and $\bar{b}$ in two different, and initially equivalent ways—a summation triangle can be formed to the left (clockwise) of $\bar{x}$ (FIG. 2A) or to the right (counterclockwise) of $\bar{x}$ (FIG. 2B).

This realization allows for the flexibility of selecting between the left or the right decomposition for any sample of x(k). Such a flexibility provides for some reduction of the power spectral density of the phase signals $\alpha(k)$ and $\beta(k)$. Such a reduction is desirable as it reduces out-of-band emissions and in-band distortions.

The distortions for which the predistortion subsystem is to compensate may come as a phase distortion, a magnitude distortion, or as a combination of both. It has been found that, without predistortion, the system output signal 110 has an amplitude modulation (AM) that is not equal to the expected and desired AM. Furthermore, the phase modulation (PM) of the system output signal 110, if predistortion is not present, deviates from the expected and desired PM. Experiments have found that the AM distortion or error (magnitude distortion) depends on the AM of the input signal. Also, it has been found that the PM distortion (or phase distortion) depends on the AM of the input signal.

It should be noted that the predistortion modification, defined as any deliberate distortion which has been applied or is to be applied to the input signal to change at least one original characteristic of the input signal, can take many forms. Two specific types of predistortion, phase predistortion and magnitude predistortion are currently envisioned although other types are possible. These two types, separately or together, can make up the predistortion modification. In some applications, only a magnitude type predistortion modification may be required while in others only a phase type predistortion is required.

One possible source of the AM/Am and AM/PM distortion is the gain and phase imbalance between the phasor fragments.

Figure 3A:
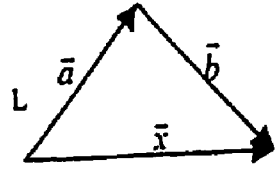
FIGS. 3A–3D illustrate how different decomposition methods used on the same vector can produce different characteristics.
Figure 3C:
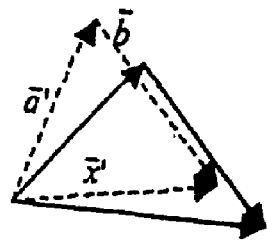
Figure 3B:
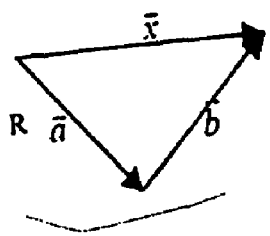

Referring to FIGS. 3A and 3B and as explained above, a vector $\bar{x}$ can be decomposed to the sum of vectors $\bar{a}$ and $\bar{b}$ in two different, and initially equivalent manners. FIG. 3A illustrates the left or clockwise decomposition while FIG. 3B illustrates the right or counterclockwise decomposition. Both summations lead to $\bar{a} + \bar{b} = \bar{x}$.

Phasor fragmentation operates under the assumption that at the point of summation the ratio between the lengths of the vectors (the magnitudes of the phasors) equals the ratio at the point of decomposition. Typically that ratio equals one, implying that both vectors are to be of equal magnitude at all times.

Any common rotation of both vectors results in a common modification of the angles and this implies a rotation of the sum $\bar{x}$. If the common rotation is constant over time, then the resulting phase rotation of the decomposed signal is not a non-linear distortion.

Figure 3D:
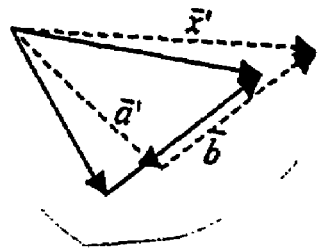

Branch imbalance between vectors $\bar{a}$ and $\bar{b}$ consists of a magnitude difference (gain imbalance) and rotation difference (phase imbalance) between the two. As an example, in FIGS. 3C and 3D, vector $\bar{a}$ is rotated to $\bar{a}'$ and while vector $\bar{b}$ remains the same. The sum is now not only caused to rotate, but the length of vector $\bar{x}$ is altered, forming a different vector $\bar{x}'$. Unfortunately, the effects of such phase imbalance is twofold: it implies magnitude distortion of the sum depending on the magnitude of the decomposed vector (AM/AM), and a constant (linear) phase distortion.

Similarly, a gain imbalance between the two vectors implies a non-linear magnitude (AM/AM) and non-linear phase (AM/PM) distortion depending on the magnitude of the decomposed vector.

Also, the effect of an imbalanced $\bar{a}'$ on the sum $\bar{x}'$ depends on the geometrical orientation of the decomposition triangle. If the left decomposition triangle is elected, a different distortion results compared to when the right decomposition triangle is elected. As a consequence of this, predistortion of such non-linear effects requires knowledge of the orientation of the decomposition triangle, and for either left or right orientation, a different pair of predistorting functions is required. These predistorting functions are denoted as the Left AM/AM predistortion function $F_L(M)$, the Left AM/PM predistortion function $G_L(M)$, the Right AM/AM predistortion function $F_R(M)$, and the Right AM/PM predistortion function $G_R(M)$. Applying a predistortion with phase and magnitude predistortion that differentiates between left and right decomposition shall be termed dual-predistortion.

Since the selection of the predistortion functions $F_L(M)$ or $F_R(M)$, and $G_R(M)$ or $G_L(M)$, depends on the orientation of the decomposition triangle for each vector $\bar{x}$ corresponding to the complex data x(k), predistortion is ideally performed after decomposition, when the elected orientation is known.

AM/AM magnitude predistortion is accomplished through modification of the opening angle $\phi$, and AM/PM phase predistortion is accomplished through modification of the resultant phase $\vartheta$. Consequently, predistortion can be accomplished by adjusting the angles $\alpha(k)$ and $\beta(k)$ of the phasors, in replacement of adjusting the magnitude and phase of x(k). Two pairs of functions $A_L(M)$, $B_L(M)$ and $A_R(M)$ and $B_R(M)$, which adjust the angles $\alpha(k)$ and $\beta(k)$, are additively conform $$\alpha'(k) = \alpha(k) + A_L(M(k))$$

$$\beta'(k) = \beta(k) + B_L(M(k))$$

or $$\alpha'(k) = \alpha(k) + A_R(M(k))$$

$$\beta'(k) = \beta(k) + B_R(M(k))$$

for the left and right decomposition triangles respectively.

The common contribution of the left predistorting adjustment is $$\frac{A_L(M) + B_L(M)}{2}$$

and it modifies the phase of the resultant vector based on the magnitude of x(k). The differential contribution of the left predistorting adjustment is $$\frac{A_L(M) - B_L(M)}{2}$$

and it modifies the magnitude of the resultant vector based on the magnitude of x(k). The same holds for the right adjustments respectively.

The angle adjustment functions $A_L(M)$ and $B_L(M)$ and $A_R(M)$ and $B_R(M)$ may be implemented by look up tables (LUTs) with linear interpolation.

As noted above, one solution to the above issues is to predistort the input signal. Further details on this approach can be found in co-pending application entitled Predistortion Circuit For a Chireix Power Amplifier Transmit System and filed with the US Patent and Trademark Office, the whole of which is incorporated herein by reference. While the predistortion solution does work, it is not as robust and as fault tolerant as may be desirable. An adaptive predistortion subsystem 200, as illustrated in FIG. 4, would compensate for changing conditions and for other distortions which the system output signal may have.

Figure 4:
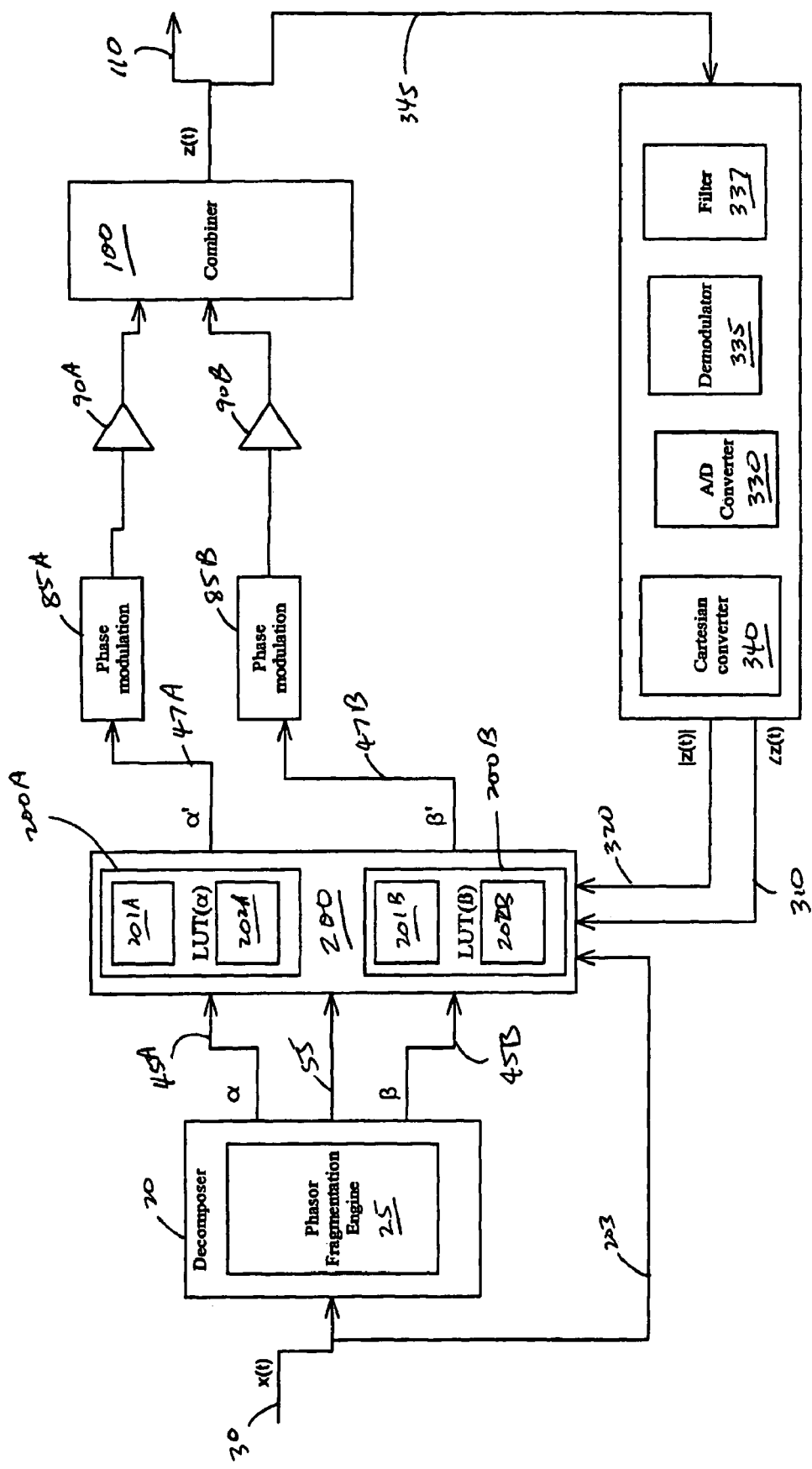
FIG. 4 illustrates a block diagram of an amplifier system which incorporates a predistortion subsystem according to one aspect of the invention and which also uses a feedback signal used by the predistortion subsystem.

Referring to FIG. 4, a block diagram of such an adaptive predistortion subsystem 200 is illustrated as being part of a signal processing system.

While an analog implementation of the subsystem 200 is possible, it has been found that a digital implementation was simpler to achieve. As such, the following description assumes that the input signal 30 is a digital signal having a digital representation of the desired AM and its PM of the output RF signal. Digital AM/AM predistortion modifies the magnitude of the complex digital input signal such that the RF output signal has the desired AM, despite the distortion. Digital AM/PM predistortion modifies the phase of the complex digital input signal such that the RF output has the desired PM, despite the distortion.

As can be seen in FIG. 4, multiple components are involved in the signal processing system which incorporates an adaptive predistortion subsystem. The input signal x(t) 30 is received by the decomposer 20. The decomposer 20, containing a phasor fragmentation engine 25 produces the signal components α45A and β45B along with the data regarding whether left or right decomposition was used. These three signals are received by the adaptive predistortion subsystem 200 which contains the α lookup table (LUT) 230 and the β lookup table 250. The subsystem 200 also receives a feedforward 203 of the input signal x(t) along with the feedback signals 320, 310 from the feedback processing block 220. The feedback processing block 220 receives a replica of the system output signal 110 from the combiner 100. The feedback processing block 220 feeds the polar equivalent of the system output signal 110 to the predistortion block 200 as the magnitude 310 of the system output signal z(t) and the phase 320 of the signal z(t).

The predistortion subsystem predistorts the α component 45A and the β component 45B based on the decomposition data 55 and the input signal x(t) 30. The predistorted α component (denoted by α' 47A) and the predistorted β component (denoted by β' 47B) are received by the phase modulation blocks 85A, 85B respectively.

Each lookup table 230, 250 consists of two internal tables—one for left decomposition (201A, 201B) and one for right decomposition (202A, 202B) Table 201A details the values to be used for the received α values for a left decomposition while table 201B details the values to be used for the received β values for a left decomposition. Similarly, table 202A contains the values to be used for the received α values for a right decomposition while table 202B contains the values to be used for the received β values for a right decomposition. As an example, if table 201A in LUT block 200A has a phase adjustment value of 0.4 at an input magnitude of 0.5, then if the magnitude value received by LUT block 200A is 0.5 and if the α value received is 0.2 and left decomposition was used, the adjustment value of 0.4 is added to the α value of 0.2 to result in the adjusted α value of 0.6 as the output of the LUT block 200A. This value is found from table 201A due to the left decomposition. If the decomposition was a right decomposition, then table 202A would have been used to find the corrective value for the received α value.

Similar to the above, table 201B in LUT block 200B is used to obtain a predistortion adjustment for the received β value. Since the decomposition was a left decomposition, then table 201B was used. If the decomposition was a right decomposition, then table 202B would be used for the corrective value for the received β value.

The adaptive predistortion subsystem 200 receives the α and β components and predistorts these components based on the different inputs such as the feedforward signal 210, the feedback signals 310, 320, and the decomposition information 55. The adaptive predistortion subsystem 200 is illustrated in more detail in FIG. 5.

It should be noted that the predistortion modification, defined as any deliberate distortion which has been introduced to the input signal to change at least the phase or magnitude of the input signal, can take many forms, two of which are phase predistortion and magnitude predistortion. These two types, separately or together, can make up the predistortion modification. In some applications, only a magnitude type predistortion modification may be required while in others only a phase type predistortion modification is required. In the embodiment explained here, the two types of predistortion, together comprise the predistortion modification.

Figure 5:
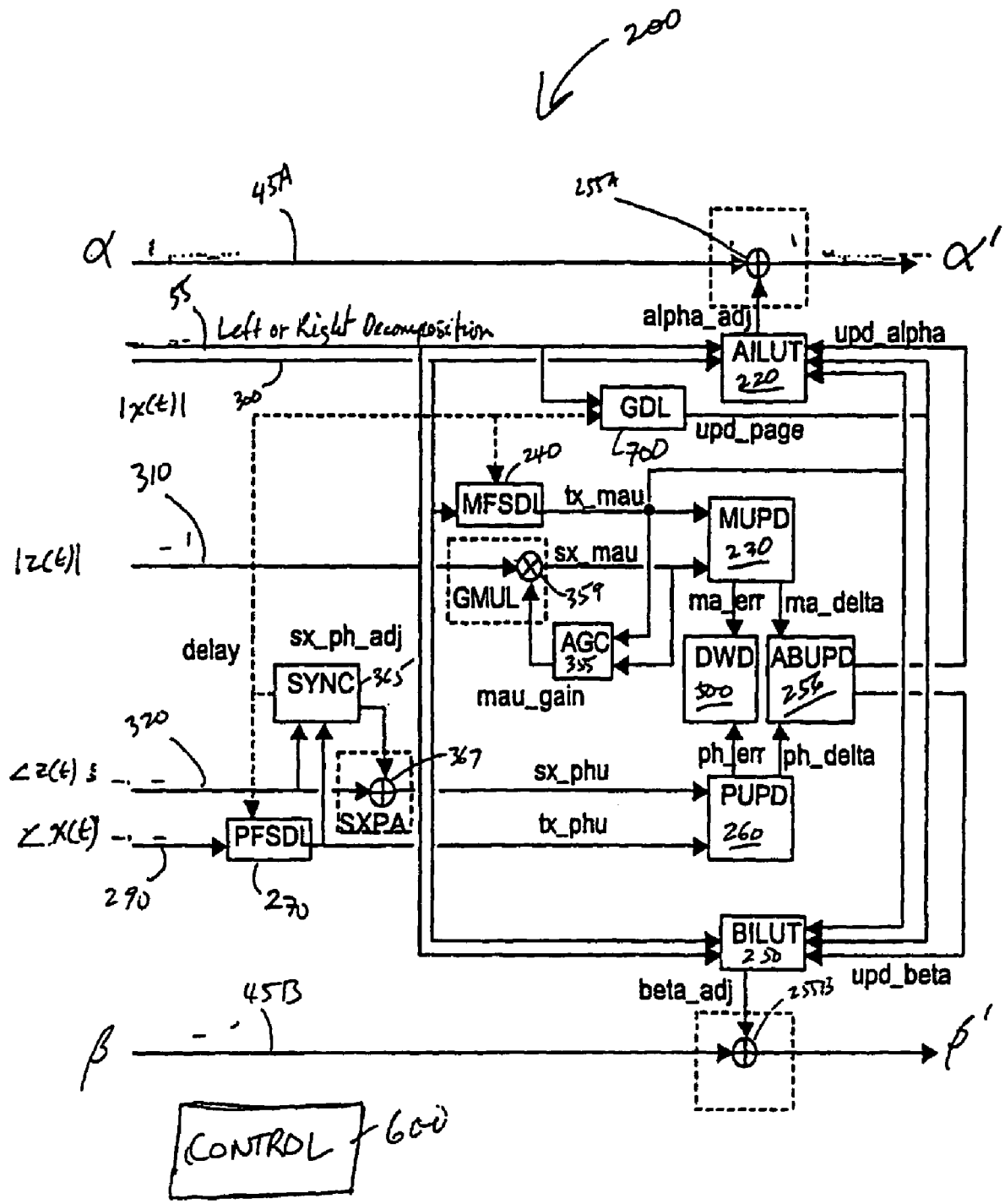
FIG. 5 is a detailed block diagram of the predistortion subsystem illustrated in FIG. 4.

Referring to FIG. 5, a more detailed block diagram of the adaptive predistortion subsystem 200 is illustrated. The α LUT 220 and the β LUT 250 each receive the magnitude of the input signal 30 (|x(t)|). Each LUT (220 and 250) also receives the decomposition information 55. As noted above, it has been found that both AM and PM distortions depend upon the AM of the input signal. Based on these inputs, the α and β LUTs 220, 250 each produce a distortion modification value that additively modifies the α and β values (45A and 45B) through adders 255A, 255B. The additively modified α and β values are output as α' (47A) and β' (47B) signals. A control block 600 contains and executes the control software which handles exceptions and initialization of the subsystem. This control software will be discussed later in this document.

The adaptive nature of the subsystem 200 stems from the ability of the subsystem to adapt to changing conditions— the entries in the LUTs 220, 250 are adjustable based on prevailing conditions. This is accomplished by the use of update blocks 230, 260. The update blocks 230, 260 receive characteristics of the input signal 30 (by way of delay blocks 240, 270) along with characteristics of the feedback signal 345 and, based on these two inputs, updates the LUTs 220, 250 by way of the update block 256. The phase update block 260 receives the phases of both the feedback signal and the input signal and determines phase error and phase updates. The magnitude update block 230 receives the magnitudes of both the input signal and the feedback signal and determines magnitude error along with magnitude updates. These updates, both phase and magnitude, are jointly translated into joint $\alpha$ and $\beta$ values by the update block 256 to be used by the respective LUTs (220, 250) as updates.

Part of the input to the update blocks 230, 250 are the characteristics of the input signal x(k). The magnitude 290 and the phase 300 of this input signal are received from the conversion unit 210. As noted above, this conversion unit converts the feedforward signal 203 from Cartesian coordinates to polar coordinates. The conversion unit 210 is convenient and makes the predistortion easier to accomplish. As is well known, signal representations using Cartesian coordinates take the form of $z=x+jy$ where x and y are the real and imaginary components. Polar coordinates take the form of $z=Ae^{j\phi}$ where the magnitude of the signal is A and its phase is $\phi$. Since both the magnitude and the phase of the signal is to be modified by the predistortion subsystem, it is clearly more convenient to accomplish this if the signal were in polar coordinates. Again as is well known, $A=(x^2+y^2)^{1/2}$ while $\phi=\tan^{-1}(y/x)$. Once the signal has been converted into polar coordinates, these characteristics of the input signal can be directly used by the LUT update blocks.

To account for changing conditions and to acquire appropriate LUT entries, a feedback mechanism is employed to adjust or adapt the lookup table entries in lookup table blocks 220, 250. Delay blocks 240, 270 ensure that the feedback sample is mated with the proper value of the input signal waveform when processing and updating the lookup table entries in lookup table blocks 220, 250. Delay block 70 also performs a delay line that delays the decomposition information 55.

The lookup tables 220, 250 internal to the predistortion subsystem 200 contain values to be added to the received $\alpha$ or $\beta$ values based on the other inputs (left or right triangle decomposition and input signal feed forward information) with the output being the predistorted signal value. Each lookup table block 200A, 200B contains dual lookup tables—a table for left decompositions (201A, 201B), and a table for right decompositions (202A, 202B). Table 201A details the values to be used for the received $\alpha$ values for a left decomposition while table 201B details the values to be used for the received $\beta$ values for a left decomposition. Similarly, table 202A contains the values to be used for the received $\alpha$ values for a right decomposition while table 202B contains the values to be used for the received $\beta$ values for a right decomposition. As an example, if table 201A in LUT block 200A has a phase adjustment value of 0.4 at an input magnitude of 0.5, then if the magnitude value received by LUT block 200A is 0.5 and if the $\alpha$ value received is 0.2 and left decomposition was used, the adjustment value of 0.4 is added to the $\alpha$ value of 0.2 to result in the adjusted $\alpha$ value of 0.6 as the output of the LUT block 200A. This value is found from table 201A due to the left decomposition. If the decomposition was a right decomposition, then table 202A would have been used to find the corrective value for the received $\alpha$ value.

Similar to the above, the table 201B in LUT block 200B is used to obtain a predistortion adjustment for the received $\beta$ value. Since the decomposition was a left decomposition, then table 201B was used. If the decomposition was a right decomposition, then table 202B would be used for the corrective value for the received $\beta$ value. The $\beta$ lookup table block 250, based on the value of $|x(t)|$ and on the other inputs, determines the proper amount of adjustment and adds the adjustment to the input $\beta$ value 45B by way of adder 225B to result in the desired predistorted signal fragment.

While the above described LUT performs an additive adjustment to the received $\alpha$ or $\beta$ values, other implementations are possible. Instead of an additive adjustment value, the LUT may also provide a multiplicative adjustment to the received value.

As noted above, the adaptive predistortion subsystem 200 in FIG. 5 is adaptive in that the values of the lookup table entries in the lookup table (LUT) blocks 220, 250 change over time to account for changing conditions or for acquiring appropriate LUT entries. This adaptability is implemented by way of a feedback signal 345 tapped from the system output signal 110. The magnitude 310 of the feedback signal 345 and the phase 320 of the feedback signal 345, are received by the predistortion subsystem 200. These two values result from processing of the system output signal 110 by the feedback processing block 220 which contains an analog/digital (A/D) converter 330, a Cartesian to polar conversion unit 340, a demodulation module 335, and a filtering module 337. As can be seen in FIG. 4, the system output signal (an analog signal) is tapped and this tapped signal 345 is received (after passing through the filtering module 337 and the demodulation module 335) by the A/D converter 330 for conversion from an analog to a digital signal.

After conversion to a digital signal, the feedback signal is converted from Cartesian to polar coordinates by the conversion unit 340. The tapped signal 345 is thus represented by the two values—the magnitude 310 of the feedback signal 345 and the phase 320 of feedback signal 345.

An automatic gain control (AGC) module 355 and a multiplier 357 combine to remove any gain in the magnitude feedback signal 310 as compared to the magnitude of the input signal 30. Similarly, a synchronization circuit 365 and an adder 367 adjust the incoming phase feedback signal 320 as compared to the phase 290 of the input signal 30.

Once the two digital feedback signals are received, they are then compared with the delayed feedforward signal coming from the delay blocks 240, 270. The updated values for the LUT entries are then calculated and entered into their respective lookup tables. It should be noted that the comparison may be done by subtracting the phase of the feedback signal from the phase of the input signal and by subtracting the magnitude of the feedback signal from the magnitude of the input signal.

To further elaborate on the above process, the update process is dependent on the difference between the tapped system output signal 345 and the input signal 30. This difference is, of course, taken after both signals are in polar coordinates. The magnitude and phase errors are defined as:

$$e_m(k)=|z(k)|-|x(k)|$$

$$e_\phi(k)=(\angle z(k)-\angle x(k))$$

where $e_m(k)$=magnitude error $e_\phi(k)$=phase error $z(k)$=magnitude of feedback signal (signal 310)

x(k)=magnitude of input signal (signal 300)

∠z(k)=phase angle of feedback signal (signal 320)

∠x(k)=phase angle of input signal (signal 290)

The lookup table entries in the LUTs are modified or updated based on the magnitude M=|x(k)|. Based on the magnitude value, one, two, or no entries in an LUT are updated as follows:

1. Obtain the update quantity δ
2. Identify the LUT entry addresses n=⌊λM⌋ and n+1, and calculate the interpolation distance s=λM−n.
3. Update table entries as follows:

$$T_n(k+1)=T_n(k)+(1-s)\cdot\delta_T \text{ iff } 0\leq n\leq(N-1)$$

$$T_{n+1}(k+1)=T_{n+1}(k)+(s)\cdot\delta_T \text{ iff } 0\leq n+1\leq(N-1)$$

From the conditions in the above equations, it is clear that two, one, or no entries are updated depending on the value of λM. The product λM will be called the virtual address, since it decomposes into two physical addresses (indices) for the LUT and an interpolation weight. Specific to the pre-distortion adaptation process, the LUT update is based on a magnitude and phase error, defined as follows:

$$e_M(k)=|z(k)|-|x(k)|$$

$$e_\phi(k)=(\angle z(k)-\angle x(k))$$

The LUTs for $A_L(M)$, $B_L(M)$ (for a left triangle decomposition) or $A_R(M)$, $B_R(M)$ (for a right triangle decomposition) are updated as follows:

1. Define a magnitude update quantity $\delta_F=\mu_F\cdot e_M(k)$ based on the magnitude error, which depends on the difference of magnitudes and an update speed parameter $0\leq\mu_F<1$.
2. Define a phase update quantity $\delta_G=\mu_G\cdot e_\phi(k)$ based on the angular error (radians) which depends on the difference of angles and an update speed parameter $0\leq\mu_G<1$
3. Determine whether z(k) originates from a 'Left' or a 'Right' decomposition triangle. This is accomplished by noting for each transmitted x(k) whether it is decomposed into a 'Left' or a 'Right' triangle.
4. If the decomposition triangle is 'Right':
   Update $A_R(M)$ using $\delta_T=-\delta_F-\delta_G$
   Update $B_R(M)$ using $\delta_T=\delta_F-\delta_G$
5. If the decomposition triangle is 'Left':
   Update $A_L(M)$ using $\delta_T=\delta_F-\delta_G$
   Update $B_L(M)$ using $\delta_T=-\delta_F-\delta_G$ In practice, AM/AM and AM/Pm distortions by the power amplifier/combiner are not the only contributors to e(k). However, gradual updating through proper selection of $\mu_F$ and $\mu_G$ allows the process to extract the distortions of interest by averaging out other distortion effects and noise.

As a general example, consider a LUT $B_R(M)$ that has been designed with N=6 entries for M≤1. It follows that α=5, allowing the full magnitude range to be mapped to the full address range of the LUT. For an update at x(k)=0.35·exp(j·2.7), we have M=0.35. The virtual LUT address 1.75 and the LUT entries of interest are addressed at n=⌊1.75⌋=1 and n+1=2. Interpolation is performed with s=1.75−1=0.75. If the corresponding sensed sample is z(k)=0.2·exp(j·2.3), then the phase error is $e_\phi(k)$=−0.4 and the magnitude error is $e_M(k)$=−0.15. Let $\mu_F$=0.1 and $\mu_G$=0.1. From the magnitude and phase errors, it follows that the updates equal $\delta_G$=−0.04 and $\delta_F$=−0.015, resulting in $\delta_T$=0.015+0.04=0.055. A weighted correction of 25%·0.055≈0.01 is applied to $T_1$ and a complementary weighted correction of 75%·0.055≈0.04 is applied to $T_2$. This update is illustrated in the table below:

| Address (n) | LUT content before update | Correction | LUT content after update |
| --- | --- | --- | --- |
| 0 | −1 | 0 | −1 |
| 1 | 2 | 0.01 | 2.01 |
| 2 | −0.5 | 0.03 | −0.47 |
| 3 | −0.5 | 0 | −0.5 |
| 4 | 0.5 | 0 | 0.5 |
| 5 | 2 | 0 | 2 |

To protect against instability under certain distortion conditions, some exceptions have to be made. The first of these is the LUT entry at address 0. The entry should be optionally frozen while allowing other LUT entries to be updated. This is done by setting (following the formula for $T_n(k+1)$)

$$T_0(k+1)=T_0(k) \text{ if } n=0$$

$$T1(k+1)=T1(k)+(s)\cdot\delta_T \text{ iff } n+1=1$$

if a freeze is desired. Such a freeze has been found to allow for added subsystem robustness if residual branch imbalances cause LUT update instability for near-zero magnitude values.

The other exception is to limit the range of amplitude values for an LUT update. By default, the magnitude range is 0≤M≤1 but LUT updates should only occur for the magnitude range $M_0\leq M\leq M_1$. The definition of this operative range is not dependent on the magnitude values corresponding to the LUT entries. LUT entries representing magnitude values beyond the limited range are still affected by the updates due to the use of interpolating adaptation. Limiting the active magnitude range has been found to improve stability, especially in the case of branch imbalance where phase distortion at near zero magnitude is severe. It has also been found to protect against instability for near-maximum magnitude values caused by inadvertent flipping due to pre-distortion.

A flip guard may also be used to protect against inadvertent flipping. As noted before, a further opening of the angle between the phasor fragments increases the magnitude of the output signal while closing the angle decreases the magnitude. If the decomposition is a right triangle decomposition, then opening the angle is done by increasing α and decreasing β. Conversely, for a left triangle decomposition, opening the angle is done by decreasing α and increasing β. This method only holds true until the magnitude is at its maximum and, after this, the modifications to α and β accomplish the exact opposite—"opening" the angle is effectively closing the angle and thereby leads to instability of the adaptation process. In such an instance, the fragments are "flipped" and what was thought as a right decomposition is really a left decomposition and vice versa.

To guard against such an eventuality, a guard flag for a table entry can be set after the application of predistortion to a magnitude corresponding to the table entry if the fragments are flipped. When the guard flag for an individual table entry is set, that table entry is no longer updated. The flag is cleared once predistortion for a magnitude corresponding to that table entry no longer flips the fragments. This is possible for an individual table entry, even when that entry is frozen, because of the interpolating effects from surrounding table entries. Defining a left guard flag as $G_L(n)$ and a right guard flag as $G_R(n)$, the guards are set and cleared as follows:

For right decomposition ($\alpha<\beta$): if $\alpha'>\beta'$ for the predistorted fragments, then set the guard $G_R(n)=1$, otherwise, clear the guard $G_R(n)=0$.

For a left decomposition ($\alpha<\beta$): if $\alpha'<\beta'$ for the predistorted fragments, then set the guard $G_L(n)=1$, otherwise, clear the guard $G_L(n)=0$.

To examine the guards during adaptation at a particular magnitude $0 \leq M < 1$, the following process is used:

For a right update: if $\delta_F<0$ and $G_R(n)=1$, force $\delta_F=0$ (i.e. perform the LUT update only using the phase update $\delta_G$)

For a left update: if $\delta_F<0$ and $G_L(n)=1$, force $\delta_F=0$ (i.e. perform the LUT update only using the phase update $\delta_G$)

From the above discussion, it should be fairly clear that two of the values underpinning most of the calculations are the values for $e_m(k)$ and $e_\phi(k)$, the magnitude and phase errors. While the equations above for these two values will provide acceptable answers, better results may be had by taking into account the phase, magnitude, and delay effects of the feedback signal (i.e. the tapped system output signal 345). However, to be able to do this, the input signal must be properly delayed so that samples from the interpolated input waveform, as obtained from the delayed input signal samples, are mated with the relevant system output signal sample. Such proper delaying should therefore take into account most, if not all, the time delay involved in the processing production, and feedback of the system output signal (round trip delay). This round trip delay is denoted as $\tau$ (seconds) and, before the LUT updating begins, the delay blocks 240, 270 acquires the delay and delays the input signal accordingly so as to time-align the input signal samples with the incoming feedback signal.

To implement this delay, a delay line is used with a depth of K, meaning K samples of the input signals may be stored in the delay line. As should be clear, each of the K samples were sampled at different instances in time. The value of K is predetermined and should be enough to allow for the maximum possible path delay between the input signal and the feedback signal. These delays are due to a combination of any of the following: digital pipelining, analog and digital filter group delays, analog propagation delays, and the system and implementation dependent delays.

Because of this delay, a time delayed version of the input signal, $x_\delta(k)$ is defined and this is ideally $$x_\delta(k) = x(k-\delta)$$

where $\delta = \tau \cdot F_s$ $F_s$ = signal sampling rate $\tau$ = delay (normal trip delay between input and system output signal feedback)

To obtain a better result for $x_\delta(k)$, linear interpolation is used to allow for fractional values of $\delta$. Thus, the delay is divided into two parts $\kappa$, the integer part of the sample (representing a discrete sample delay at the sample rate $F_s$), and $\nu$, a fractional sample of the delay.

Using this notation, the delayed portion of the input signal can be represented as:

$$x_\delta(k) = (1-\nu) \cdot x(k-\kappa) + \nu \cdot x(k-\kappa+1)$$

where $\delta = \tau \cdot F_s$ $\kappa = \lfloor \delta \rfloor$ $\nu = \delta - \kappa$ As can be seen, for an integer $\delta$, $x_\delta(k) = x(k-\delta)$.

The above Cartesian equation can be applied to polar representations by having separate delay lines for magnitude ($|x_\delta(k)|$) and phase ($\angle x_\delta(k)$) using the sequences $|x(k)|$ and $\angle x(k)$. These are given by:

$$\angle x_\delta(k) = (1-\nu) \cdot \angle x(k-\kappa) + \nu \cdot \angle x(k-\kappa+1)$$

$$|x_\delta(k)| = (1-\nu) \cdot |x(k-\kappa)| + \nu \cdot |x(k-\kappa+1)|$$

It should be fairly clear that $x_\delta(k)$ is calculated from the samples $x(k), x(k-1), x(k-2), \ldots x(k-\kappa)$, samples of the input signal taken at time $k, k-1, k-2, \ldots k-\kappa$.

The above equations for $\angle x_\delta(k)$ has a peculiarity that is due to the way angle values work. Since $\angle x(k-\kappa)$ and $\angle x(k-\kappa+1)$ are represented by modulo $2\pi$ radians (360 degrees) and since $-\pi \leq \angle x(k) \leq \pi$, then errors could easily occur.

Thus, if $-\pi \leq \angle x(k) \leq \pi$, and if $|\angle x(k-\kappa+1) - \angle x(k-\kappa)| \geq \pi$, then $$\angle x_\delta(k) = (1-\nu) \cdot \angle x(k-\kappa) + \nu \cdot (\angle x(k-\kappa+1) + 2\pi) \text{ if } \angle x(k-\kappa+1) \leq \angle x(k-\kappa)$$

$$\angle x_\delta(k) = (1-\nu) \cdot \angle x(k-\kappa) + \nu \cdot (\angle x(k-\kappa+1) - 2\pi) \text{ if } \angle x(k-\kappa+1) > \angle x(k-\kappa)$$

The above described delay can be implemented by cascaded delay elements and associated sample storage. FIG. 6 illustrates such a delay subsystem which can be used as delay blocks 240, 270. As can be seen, delay elements 242A, 242B, 242C, 242D, 242E are cascaded and provide delays and storage for input signal samples 244A, 244B, 244C, 244D, 244E. Switches 245A, 245B, 245C, 245D, 245E allow any one of the signal samples 244A–244E to be switched so that it can be used. These samples 244A–244E can be weighted accordingly by programmable weighting blocks 246A, 246B, 246C, 246D, 246E. The weighted samples are then summed up by adder 248 to produce the delayed signal 249 to be used by the system. The switches 245A . . . 245E and the values in the weighting blocks 246A . . . 246E may be user/system controllable so that any combination of weighted samples may be produced.

As an example, if $\tau \cdot F_s = 2.4$ samples is required, then a value of 0.6 is used by the weighting block 246C and a value of 0.4 is used by the weighting block 245D. Then, by closing switches 245C and 245D then the sample $x(k-2.4)$ is obtained.

The phase correction required for the feedback portion of the system output signal is also dependent on the delayed signal $x_\delta(k)$. The complex phase difference between the delayed signal $x_\delta(k)$ and the system output signal $z(k)$, represented by $\gamma$, is due in part to the round trip delay and to other factors. The phase correction and delay can be found by executing the following process:

1. Reset the running-maximum register set $P_{max}=0$
2. Reset the phase correction: set $y=0$
3. Preset the variable interpolating delay line (discussed above as a delay subsystem): set $\delta=\delta_0$ (i.e. $\kappa=\kappa_0$ and $\nu=\nu_0$)
4. Perform a coarse search: select only interpolating delay line integer sample-delay increments of $\delta$ (maintain $\nu=\nu_0$, increment $\kappa$ only): set the coarse and fine delay increments to $\Delta\kappa=1$ and $\Delta\nu=0$.

5. Start with the first correlation window n=0. Time instance k=0 signifies the commencement of the search.
6. "Integrate": calculate the inner product $$P_\partial = A_{MAC} \cdot \sum_{k=n \cdot W}^{n \cdot W + W - 1} \exp(j \cdot (\angle x_\partial(k) - \angle z(k)))$$

This is a complex multiply-and-accumulate (MAC) covering a time window of W current samples. Note that the above notation strictly implies that the correlation windows n=0,1,2, . . . are adjoined, yet this is not an operational requirement. A spacing between windows translates to a lengthening of the search.
7. "Dump": compare the complex magnitude $|P_\delta|$ with the value $P_{max}$, and if $|P_\delta| > P_{max}$ then
   (a) update the maximum: set $P_{max} = |P_\delta|$
   (b) update the delay: retrieve the corresponding value of $\delta$ and store it as $\delta_{max}$ and
   c) update the angle: if fine searching store the angle $y_\delta = \angle P_\delta$
8. Proceed to the next window: set n=n+1, and increment $\delta$ by $\Delta\kappa + \Delta\nu$
9. Repeat from Step 4, until the full integer (coarse) delay range $\kappa = \kappa_0$ . . . $K_\nu$ of the interpolating delay line is exhausted. ($K_\nu$ is the maximum variable delay, $K_0$ is the starting coarse delay value for the search)
10. Store $\delta_{max}$ as $\delta_1$.
11. Read the programmed fine search step size $\Delta\nu$.
12. Repeat Steps 1 and 4 to 8 for the fine search: employ fractional-sample increments of $\Delta\nu$, covering the delays $\delta_1 - 1 \leq \delta \leq \delta_1 + 1$, ensuring not to exceed $0 \leq \delta \leq K_\nu$
13. Store $\delta_{max}$ as $\delta_2$.
14. Set and freeze the interpolating delay line delay to $\delta_2$.
15. Apply the phase correction y Once the fulfill course range is exhausted, the stored $\delta$ value $\delta_{max}$ is used as a starting point for a fine search. With $\Delta\kappa=0$, the $\Delta\nu$ is incremented fractionally so as to search the delays $\delta_1 - 1 \leq \delta \leq \delta_1 + 1$. Once found (using an analogous loop to that used for the coarse search), the phase correction $\gamma$ is found along with the proper delay value. It should be clear that $\gamma = \angle P_\delta$.

Updating of the phase LUT is only to be accomplished after the phase synchronization of the feedback signal. Freezing the phase LUT update can be done by setting $\mu F=0$ and $\mu G=0$.

After the phase correction is done, the magnitude of the feedback signal z(k) has to be adjusted as well. This adjustment is required to compensate for any gain in the system output signal relative to the input signal. Magnitude adjustment is accomplished by directly multiplying the feedback signal z(k) by a factor $A_{sx}(k)$. This is found using the following formula:

$$A_{sx}(k+1) = A_{sx}(k) + \mu_A \cdot (|x_\delta(k)| - A_{sx}(k) \cdot |z(k)|)$$

For $k_A \leq k \leq k_A + W_A - 1$ where
 $k_A$=commencement time for the magnitude adjustments (preferably as early as possible)
 $W_A$=number of samples for which the adjustments are performed
 $\mu_A$=update step size and $0 \leq \mu_A \leq 1$ $A_{sx}(k_A)$, $\mu_A$, and $W_A$ can be programmable.

Figure 6A:
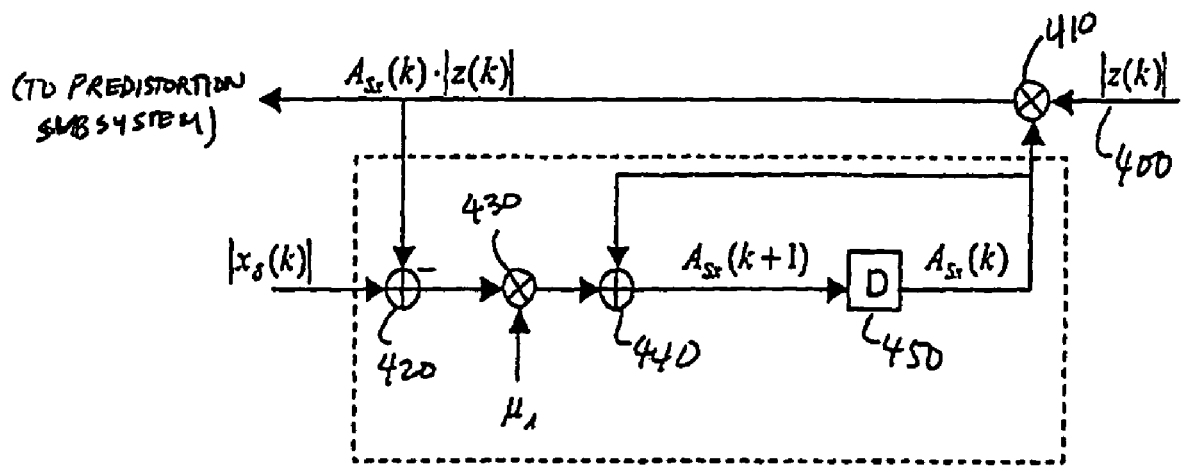
FIG. 6A is a block diagram of a magnitude adjustment circuit which may be used in the predistortion subsystem illustrated in FIG. 5.
Figure 6:
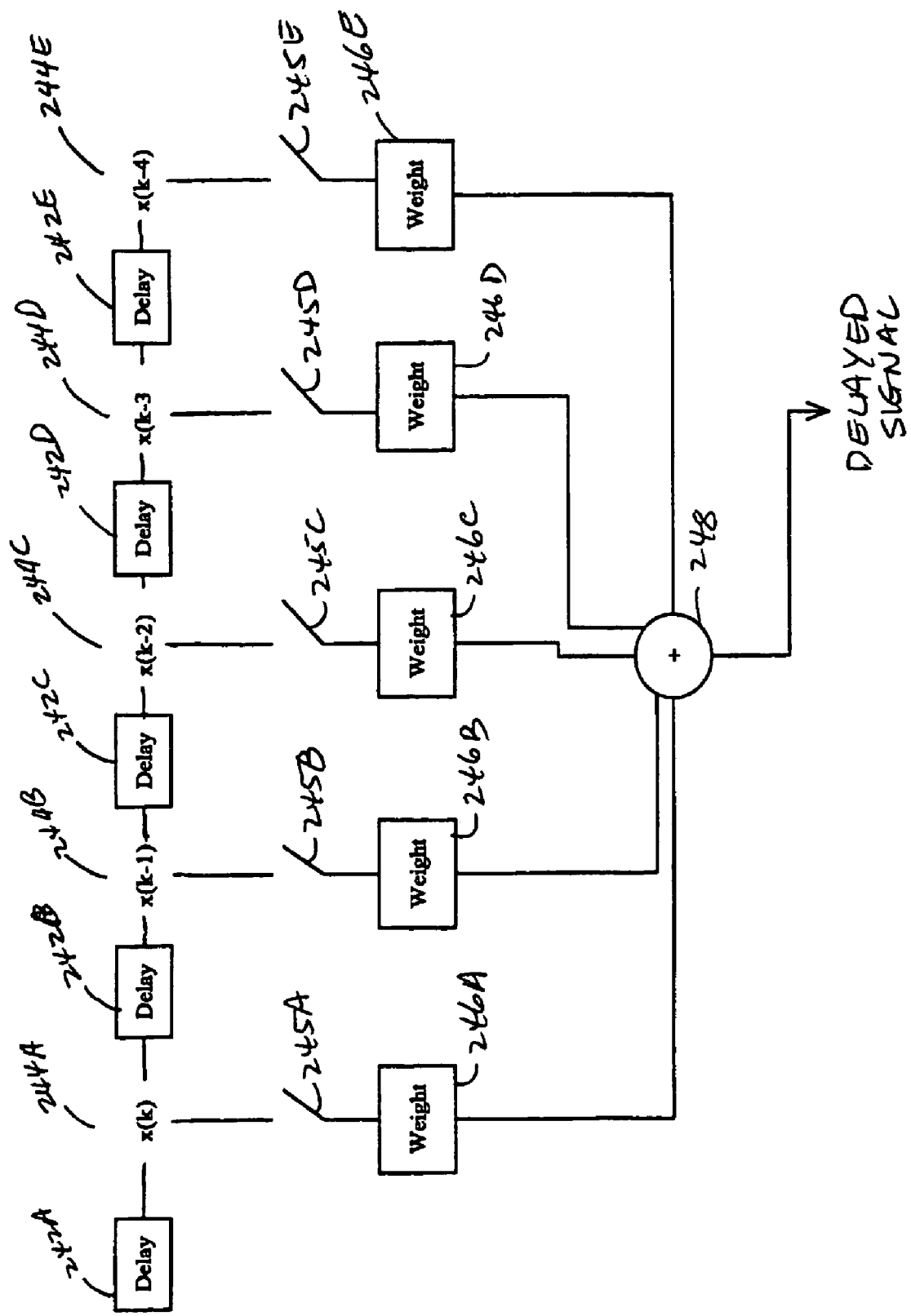
FIG. 6 is a block diagram of a delay line circuit which may be used in the predistortion subsystem of FIG. 4.

Referring to FIG. 6A, a circuit for implementing the magnitude adjustment is illustrated. As can be seen, the magnitude 400 of the portion of the system output signal is multiplied with the factor $A_{sx}(k)$ by way of multiplier 410. The result is to be used in calculating the desired predistortion modification. This result is also subtracted from the magnitude ($|x_\delta(k)|$) of the delayed signal by way of adder 420. The result of the subtraction is multiplied by the update step size $\mu_A$ by way of multiplier 430 and added to the factor $A_{sx}(k)$ by adder 440 to produce the next value in the sequence for the factor. The delay element 450 delays the resulting value until it is ready for use.

The feedback signal (the tapped system output signal 345 which is a replica of the system output signal 110) may be further processed to achieve better results. As an example, the gain and/or phase of this replica of the system output signal may be adjusted for better coordination with the delayed replica of the input signal.

While the above embodiment utilizes LUT entries that are adjusted based on the difference between the input signal and the system output signal, the system output signal alone may be used, if desired, in adjusting the LUT entries. This alternative would require the modulation of the system output signal and the regeneration of a signal similar to the input signal. Successful recovery is possible if the amount of distortion is restricted such that demodulation can occur without errors. This approach is not desirable if the input signal is readily available to be used in determining the parameters of the adjustments. Another alternative involves measuring the distortion by measuring the amount of out-of-band energy. Adjustments can then be made to minimize the amount of out-of-band energy and, consequently, minimize the distortion.

Referring to FIG. 5, a distortion monitor 500 is illustrated as receiving input from both update blocks 230, 260. The distortion monitor 500 monitors the distortion by way of the error functions defined as:

$$e_M(k) = A_{Sx} \cdot |z(k)| - |x_\delta(k)|$$

$$e\vartheta(k) = (y + \angle z(k) - \angle x_\delta(k))$$

where $\gamma$ is the complex phase difference between $x_\delta(k)$ and z(k). By monitoring the distortion, the predistortion subsystem can detect LUT divergence. If such a condition is detected, a full or a partial re-initialization may be in order.

The error signals given above are weighted as:

$$\eta(k) = s \cdot |e_M(k)| + (1-s)|e_\phi(k)|$$

with $0 \leq s \leq 1$. The averaging of $\eta(k)$ can be done using a leaky integrator $$E(k) = \lambda \cdot \eta(k) + (1-\lambda)(\eta(k-1)$$

where the update parameter is $\lambda$.

Figure 5B:
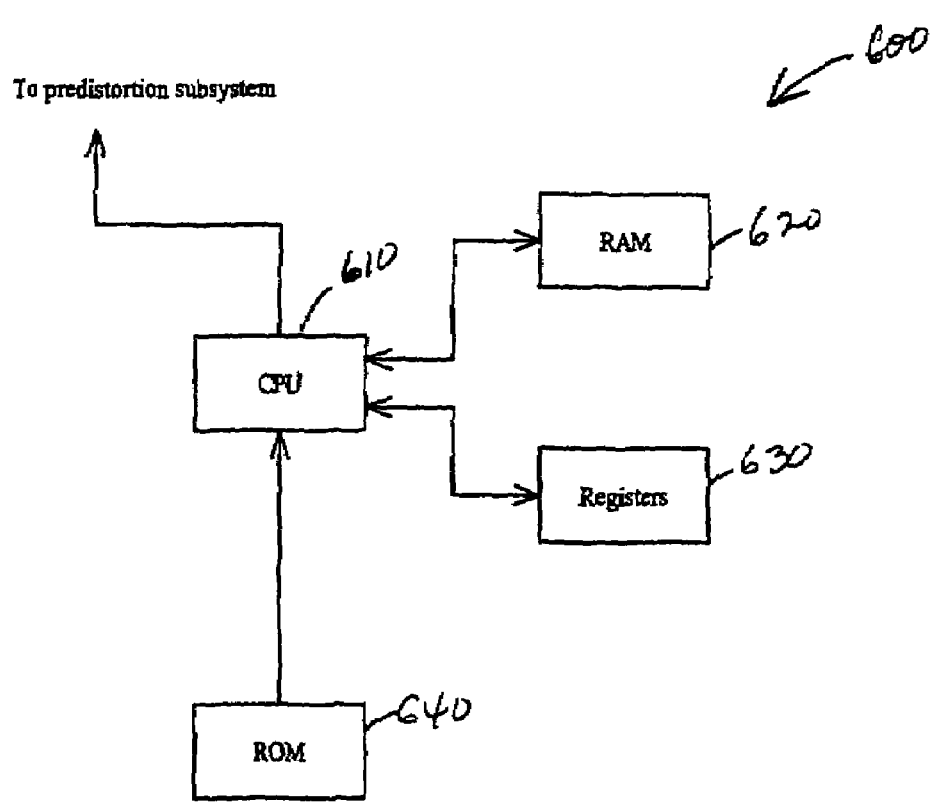
Figure 5A:
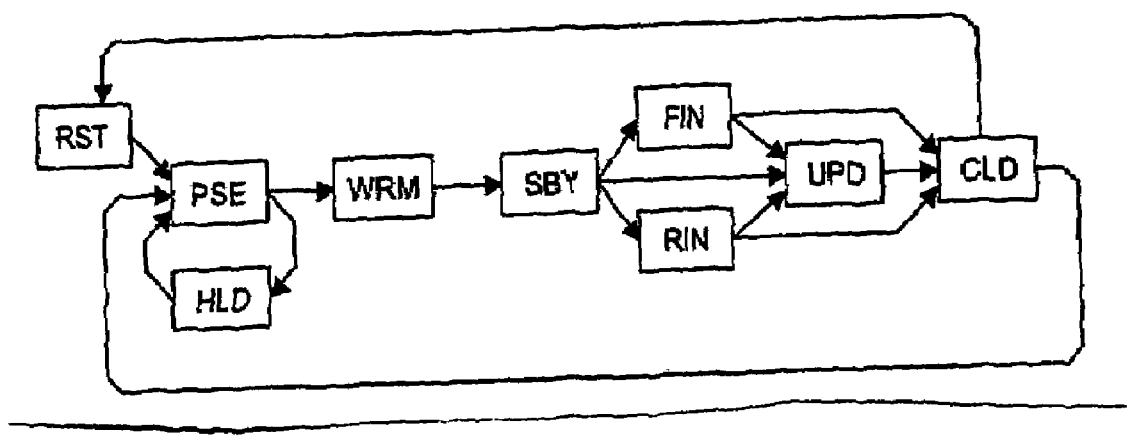
FIG. 5A is a block diagram of one type of control block which may be used in the predistortion subsystem of FIG. 4.
Figure 5C:
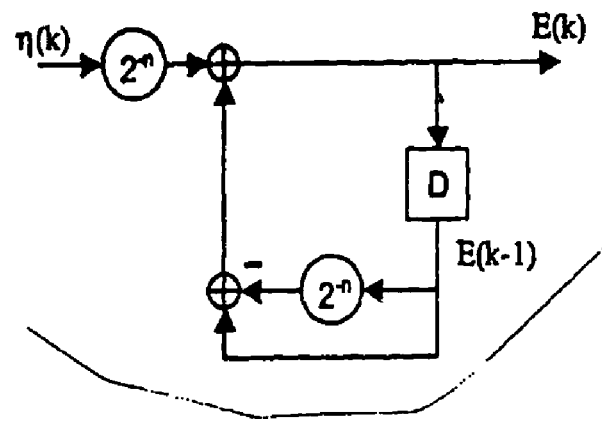
FIG. 5C is a block diagram of a leaky integrator which may be used in the distortion monitor illustrated in FIG. 4.

The leaky integrator may be implemented as in the block diagram in FIG. 5C where $\lambda = 2^{-n}$ which reduces the two multiplication operations into two simpler shift functions and one add function. This leaky integrator is a first order infinite impulse response low pass filter.

The error functions given above in relation to the distortion monitor many be used in place of the previous error functions for better results.

The control software for the above described predistortion subsystem allows for different actions to be taken for different conditions. The software can be viewed as a state machine with each state allowing the subsystem to execute specified actions. Thus, when the subsystem enters a specific state, it is equivalent to running a subroutine as specific actions and tasks are executed by the subsystem.

The control software and its analogous state machine can therefore be viewed as a control system that determines the actions of the predistortion subsystem. The various states and the steps taken when the predistortion subsystem enters it are listed and explained below:

State: Reset [RST]

The reset state resets all variables in the subsystem to their initial values and commences the synchronization and adaptation of the LUTs without regard to previous results or actions.

This reset state is activated through a reset external to the subsystem or through a self reset condition. The actions taken for a reset are, in order:

1) All LUT entries are reset to an all-zero state and the update function is disabled.
2) The predistortion subsystem is disabled and the signals bypass the additive modification such that (referring to FIG. 5) $\alpha'=\alpha$ and $\beta'=\beta$.
3) The LUT entries are loaded with preset values or, alternatively, maintain all-zero entries for all LUT entries and disable the update function.
4) Preset the automatic gain control module 355 to a specific, predetermined and preprogrammed value (such as 1) to prevent further adjustments to the feedback magnitude signal 310.
5) Preset the synchronization circuit 365 to a specific, predetermined and preprogrammed value (such as zero) to prevent further adjustments to the feedback phase signal 320.
6) Preset the distortion monitor 500 with a preprogrammed starting value by loading the leaky integrator with a predetermined value. Alternatively the distortion monitor may be set to zero.
7) Preset the delay line to its starting value.
8) Reset the initialization duty control (a control value to be discussed later).
9) Reset the update duty control (a control value to be discussed later).
10) Reset the distortion watch dog (to be discussed further below).
11) Disable the feedback from the system output signal.

When in the reset state, the predistortion subsystem 200 executes all of the actions listed above. During this time period, the predistortion subsystem 200 is bypassed as noted in the second item above.

State: Pause [PSE]

During the Pause state, all the functions of the predistortion subsystem 200 are halted and all the settings, values, variables, and entries in the subsystem are frozen and feedback is off.

State: Hold [HLD]

The Hold state is analogous to the Pause state with the exception that the subsystem, except for feedback, is functioning. The predistortion subsystem 200 freezes all the variables and LUT entries and turns off the feedback from the system output signal which still predistorting the $\alpha$ and $\beta$ signals. However, the $\alpha$ and $\beta$ LUT entries are not being adjusted.

State: Warm Up [WRM]

The Warm Up state is the same as the Pause state with the exception that the feedback from the system output signal enabled.

State: Update [UPD]

For the update state, the settings for the synchronization circuit 365 and the gain control module 355 and the delay blocks 240, 270 are frozen while the reset of the subsystem 200 functions normally.

State: Full Initialization [FIN]

The full initialization state initializes the update and feedback circuitry. In this state, the LUT entries are frozen in that the update blocks 220,260 are disabled while the feedback path is active along with the additive adjustments of the $\alpha$ and $\beta$ values. However, the distortion monitor control value and update duty control are both reset along with the update speed control (to be discussed below).

State: Re-Initialization [RIN]

For re-initialization, the feedback gain and phase adjustments (performed by gain control circuitry 355 and the synchronization circuitry 365) are adjusted while the delay settings (for the delay blocks 240, 270) are not modified. For this state, the $\alpha$ and $\beta$ update blocks are disabled but predistortion continues. The distortion monitor control value is reset while the gain control block 355 and synchronization blocks 365 are operative.

State: Cool Down [CLD]

The cool down state maintains the feedback function after an LUT update to avoid problems which may be caused by the feedback circuit. It initiates a cool down timer, the duration of which is user configurable to enable avoidance of the feedback related problems. During this state, the distortion monitor is disabled (frozen) and the other relevant settings, such as the LUT entries, the setting for the gain control 355, the delay blocks 240, 270, and the synchronization circuitry 365, are also frozen. More importantly, the $\alpha$ and $\beta$ LUTs are also disabled such that $\alpha'=\alpha$ and $\beta'=\beta$.

The state transitions which the control block 600 undergoes between the different states is detailed in the table below. To assist in the understanding of the transition table below, FIG. 5A is presented. FIG. 5B is a state transition diagram illustrating the different states and the sequence of state transitions possible. For clarity, a listing of the timers implemented by the block 600 is also presented below.

| | State Transition Table | |
|---|---|---|
| From | To | Condition |
| any | RST | Reset externally applied to subsystem |
| RST | PSE | Completion of RST operations |
| PSE | WRM | Transmit process enable and update request |
| | HLD | Transmit process enable otherwise |
| WRM | SBY | Start of transmit packet samples at predistortion subsystem |
| SBY | FIN | Expiration of SBY timer and<br>1. First SBY since last RST or<br>2. Full initialization procedure incomplete since last FIN or<br>3. Full initialization request |
| | RIN | Expiration of SBY timer, and SBY to FIN conditions do not apply, and |

-continued

State Transition Table

| From | To | Condition |
|---|---|---|
|  | UPD | 1. Reinitialization procedure incomplete since last RIN or 2. Reinitialization request Expiration of SBY timer, otherwise |
| UPD | CLD | End of transmit packet samples at predistortion subsystem |
| CLD | RST | Expiration of CLD timer and Reset request |
|  | PSE | Expiration of CLD timer otherwise |
| HLD | PSE | End of transmit packet samples at predistortion subsystem |
| FIN | CLD | End of transmit packet samples at predistortion subsystem |
|  | UPD | Otherwise |
| RIN | CLD | End of transmit sample packets at predistortion subsystem |
|  | UPD | Othewise |

Timers Implemented by Control Block

| Configuration Parameter | Description | Range |
|---|---|---|
| SBY-Timer | Timer duration | 0, 2, 4, 8, 16, 32, 64, or 128 samples |
| CLD-Timer | Timer duration | 0, 2, 4, 8, 16, 32, 64, or 128 samples |
| RTO-Timer | Recency time-out timer | 0 . . . 1 s in steps of at least 1 ms and 'inf' |

To build in more flexibility and robustness in the predistortion subsystem 200, the update speed parameter $\mu_G$ and $\mu_F$ are, as noted above, configurable. Another lookup table, internal to the control block 600, provides 4 possible settings for each of the update speed parameters. These possible values and the time slot (expressed in terms of the number of symbols received) for which they would be used are listed in the table below.

| $\mu_F$ | $\mu_G$ | Time slot (expressed in a symbol count, during which the LUTs are updated) |
|---|---|---|
| ½ | ¼ | 0 . . . 15 |
| ¼ | ⅛ | 16 . . . 47 |
| ⅛ | ⅛ | 48 . . . 79 |
| 1/16 | ⅛ | 81 and beyond |

As noted above, an update duty control (a control value) is also used by the control block 600. The update duty control is a value which determines how often an LUT update is to be performed. In one contemplated application of the invention, the data in the signal to be predistorted arrives in discrete packages or packets with each packet containing multiple OFDM (Orthogonal Frequency Division Multiplexing) symbols. The LUT update duty cycle is expressed in terms of a fraction of the number of packets during which updates are performed. For instance, at a duty cycle of 1 the system updates the LUT's during all transmit packets, at 1/9 the system updates the LUT during the first packet, and then freezes the LUT during the following 8 packets: transmission and pre-distortion then occurs by means of the Hold state. In this case the cycle is 9 packets, the duty is one packet, and the idle time is 8 packets. More precisely, the duty cycle is defined by the idle time, and after expiration of the idle time an update request is issued.

In this application of the invention, the duty cycle is defined by the idle time with a request for an LUT update being made after the idle time has expired. The duty cycle may be defined by other criteria such as the number of packets transmitted but, for this application, it was found that the idle time was a more convenient choice.

It should however be noted that the duty cycle is not operative at all times. It is only applied after a specified delay of a specified number of symbols has been received. Before the symbol count, an LUT update is requested for each packet. A reset of the update duty control value accomplishes a start of a new period starting with a duty and a start of the delay symbol count. The duty is therefore 100% for an initial number of symbols after a reset of the update duty control value and, subsequently, the duty is as configured.

The table below documents the different possible values for the delay symbol count configuration.

| Configuration Parameter | Description | Range |
|---|---|---|
| UDC-IDL | Idling time between update requests | 0, $2^1$ . . . $2^6$, and 'inf' packets (8 possible values) |
| UDC-DLY | Delay in terms of a transmit symbol count after which the duty cycle applies | 0, $2^1$ . . . $2^6$, and 'inf' symbols (8 possible values) |

For clarity, a value of "inf" for the idle time denotes no duty (no LUT updates requested as ever) and a value of 0 for the idle time denotes LUT updates for each packet. A delay value of 0 denotes that the duty cycle is effective immediately.

Another control value used by the control block 600 is the initialization duty control. This initialization duty control value control how many initializations are performed for every update of the LUTs. The initialization duty cycle is expressed in terms of a fraction of the number of update packets at the start of which an initialization is performed. For instance, at a duty cycle of 1 the system performs an initialization at the start of all update transmit packets, at 1/9 the system initializes at the first update packet, and performs an update without initialization during the following 8 update packets. In this case the cycle is 9 update, the duty is one update, and the idle time is 8 updates.

The distortion monitor 500 may, depending on the implementation, be a simple component that issues an alarm if the distortion exceeds a certain preset distortion value. However, a more complex yet more useful and robust implementation is possible. Such an implementation may use multiple states and state transitions for the distortion monitor. These states can be as follows:

Reset (resets the monitor)

Measure (monitors the distortion metric and requests a predistortion subsystem recovery of the distortion metric exceeds the preprogrammed threshold)

Freeze (holds the state of the distortion metric between packets or during initialization or re-initialization of the predistortion subsystem)

No Monitor (disables the alarms and does not monitor the distortion metric. This allows the predistortion subsystem to converge and the distortion to settle)

Monitor (compares the distortion metric with the programmed threshold and enables the triggers to be tripped if the threshold is exceeded)

Different alarm levels and states may also be implemented such that, depending on the alarm level and state, different actions may be taken to address the distortion (e.g. fill initialization of the subsystem, a reset of the subsystem, a re-initialization etc.).

To execute and implement the states noted above and to execute the software, the control block 600 may be implemented as a general purpose central processing unit with attendant circuitry. Referring to FIG. 5B, a block diagram of such a control block 600 is illustrated. The CPU 610 is coupled to some random access memory (RAM) 620, a register file 630, and read only memory (ROM) 640. The CPU 610 performs the execution of the software and interfaces with the predistortion subsystem 200 while the registers 630 and the RAM 620 hold the temporary values (such as the various control values) required by the software in the CPU 610. The ROM 640 holds the software being executed by the CPU 610.

While the control block 600 above is illustrated as a general purpose data processing system, other implementations, such as a application specific integrated circuit (ASIC) or combinational logic circuit in which the logic of the software is hardwired in the hardware, are possible.

Regarding the amplifier subsystem 10, FIG. 4 illustrates one embodiment of the subsystem 10. In FIG. 4, the signal decomposer 20 of FIG. 1 comprises a phasor fragmentation engine 20A along with phase modulation units 60A, 60B. The fragmentation engine 20A receives the magnitude (M) and phase (φ) representing the predistorted signal. The phasor fragmentation engine 20A deconstructs a predetermined modulation waveform (the predistorted signal) into signal components which are of equal and constant magnitude. Further information regarding the phasor fragmentation engines may be found in the applicant's co-pending application U.S. application Ser. No. 10/205,743 entitled COMPUTATIONAL CIRCUITS AND METHODS FOR PROCESSING MODULATED SIGNALS HAVING NON-CONSTANT ENVELOPES, which is hereby incorporated by reference. In FIG. 4, these signal components are denoted by angles α and β. These components are each received by the predistortion circuit blocks 120A, 120B which, respectively, contain LUT blocks 200A, 200B. The predistortion circuit blocks 120A, 120B also receive the input signal 30 along with the decomposition information 45A, 45B from the decomposer 20. The output of these predistortion circuit blocks 120A, 120B are received by phase modulation and filtering blocks 60A, 60B which process the predistorted components to produce phase modulated and filtered versions of the components. The signal component 70A is an RF signal with predistorted phase α while signal component 70B is an RF signal with predistorted phase β. These components 70A, 70B are then amplified by amplifiers 90A, 90B. The amplified components are then recombined using combiner 100. Signal decomposition methods other than the phasor fragmentation referred to above may also be used by the signal decomposer 20.

Regarding the Chireix architecture amplifier subsystem 10, it has been found that, for higher amplification efficiencies, switch mode amplifiers are preferred for the amplifiers 90A, 90B. Such switch mode amplifiers, specifically Class D and Class F power amplifiers, provide low output impedances that allow higher amplification efficiencies. A co-pending application filed on Oct. 16, 2002 and having U.S. Ser. No. 10/272,725 entitled CHIREIX ARCHITECTURE USING LOW IMPEDANCE AMPLIFIERS provides further information on the desirable components and is hereby incorporated by reference. Such types of amplifiers are not required for the invention to function but they have been found to provide performance at a desirable level.

It should further be noted that while there are only two parallel amplifiers 90A, 90B in FIG. 1 and FIG. 4, multiple parallel amplifiers may be used as long as the decomposer 20 decomposes the input signal 30 into enough components so that each component is separately amplified and phase modulated in parallel with the other components and as long as each component is also predistorted in parallel by multiple predistortion circuit blocks.

It should also be noted that the predistortion subsystem 10 explained above does not linearize a power amplifier as is well-known in the field. Instead, the predistortion subsystem linearizes a whole power amplifier system—the output of the whole amplifier system is linearized and not simply the output of a single amplifier. Also, unlike the linearizing systems for power amplifiers that are currently known, the amplifier system discussed in this document compensates for distortions that mostly occur at mid signal amplitudes. Current single amplifier linearization systems linearize distortions that occur at large signal amplitudes.

It should further be noted that the invention may be applied to any signal processing system which decomposes a signal into components and recombines them. It has been found that signal combiners (block 100 in FIG. 1) invariably cause distortions. These combiners use addition to recombine the components and improper signal addition, such as when recombining sinusoidal components, has been found to be one cause of the distortions in the system output signal. In the above embodiment, the phasor fragmentation engine decomposes the incoming signal into vectors and the improper addition of these vectors by the combiner 100 lead to distortions in the output signal.

Figure 7:
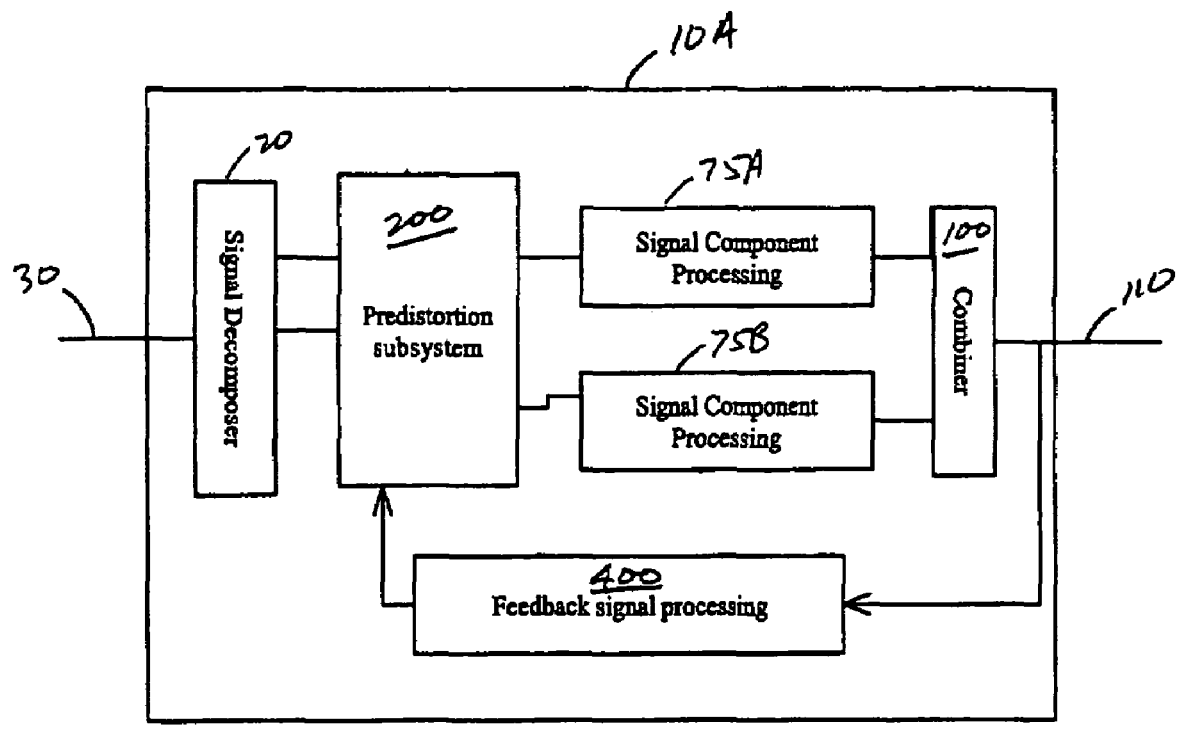
FIG. 7 is a block diagram of a signal processing system according to another embodiment of the invention.

While the above embodiment amplifies the input signal, albeit separately for each component, this need not be the only signal processing accomplished after the input signal is decomposed. Referring to FIG. 7, such a generalized system 10A (which could be part of a larger signal transmission system) is illustrated. The signal decomposer receives an input signal 30 and decomposes it into multiple components. The predistortion subsystem 200 predistorts these components and compensates for distortions introduced in the system output signal 110 by the improper or imperfect recombining of the input signal's components. These components are produced by the signal decomposer 20 and are separately processed by signal component processor blocks 75A, 75B. The processing executed by the blocks 75A, 75B may take the form of amplification (as in the embodiment above), phase modulation, a combination of the two, or any other signal processing which may be desired. As an example, each of the signal components illustrated in FIG. 4 may be separately phase modulated in addition to being amplified by amplifiers 90A–90B. The phase modulation may be accomplished separately or be incorporated in the signal decomposer or, as contemplated for the implementation illustrated in FIG. 4, incorporated into the modulation and filtering blocks 60A, 60B.

As can be seen in FIG. 7, the signal processing subsystem 10A receives the input signal and decomposes it by way of the signal decomposer 20 into components. The predistortion subsystem then predistorts the components. These predistorted components are then separately processed by the signal component processor blocks 75A, 75B and are then recombined by the recombiner 100.

A feedback signal processing block 400 receives a portion of the system output signal 110 and processes this portion so it may be used by the adaptive predistortion subsystem 120. As an example, the feedback signal processing block 400 may contain the A/D converter 330, the conversion unit 340, the filtering module 337, and the demodulation module 335 illustrated in FIG. 4. The same block 400 may also contain processing blocks 410, 420 for adjusting the magnitude and/or phase of the feedback signal.

One advantage using the above invention is that it allows less stringent tolerances to be used for the system components. Previously, components had to be substantially matched so that signal processing could produce acceptable results. By using the above invention, less than substantially matched components may be used together. Errors due to a mismatch may be measured and compensated for by the predistortion subsystem.

A person understanding this invention may now conceive of alternative structures and embodiments or variations of the above all of which are intended to fall within the scope of the invention as defined in the claims that follow.

I claim:

1. A preprogrammed control device for use in controlling an adaptive predistortion subsystem, said device being programmed to operate in a plurality of states associated with sets of commands to be executed by said subsystem in response to said device being in said states, the device comprising:
   a processor means for receiving and processing data;
   first memory means for storing said data; and
   second memory means for storing preprogrammed settings for said device, wherein
   said device is adapted to transition from a first one of said states to a second one of said states in response to detection of at least one of a set of conditions based, at least in part, on said processed data.

2. The control device according to claim 1 wherein said device controls an update duty cycle for said subsystem, said update duty cycle being determinative of how often said subsystem updates at least one internal lookup table.

3. The control device according to claim 1 wherein said device controls an initialization duty cycle for said subsystem, said initialization duty cycle being determinative of how often said subsystem initializes itself.

4. The control device according to claim 3 wherein said initialization duty cycle is dependent on how often said subsystem updates at least one internal lookup table.

5. The control device according to claim 1 wherein said control device is adapted from said first state to said second state based, at least in part, on input from a distortion monitor which monitors a level of distortion for said subsystem.

6. A programmable control device capable of controlling a predistortion subsystem for a transmission system, the programmable control device being programmable to operate in a plurality of states, one or more of the states being associated with one or more commands to be executed by the predistortion subsystem in response to the programmable control device being in an associated state, the programmable control device comprising:
   a processor capable of processing data relating to a status of the predistortion subsystem; and
   a memory circuit capable of storing settings for the programmable control device;
   wherein, responsive to the processed data, said processor is adapted to transition from one of said states to another of said states based at least in part on the settings of said memory circuit.

7. The programmable control device as claimed in claim 6, said processor being capable of controlling an update duty cycle for the predistortion subsystem, the update duty cycle being determinative of how often the predistortion subsystem updates at least one lookup table.

8. The programmable control device as claimed in claim 6, said processor being capable of controlling an initialization duty cycle for the predistortion subsystem, the initialization duty cycle being determinative of how often the predistortion subsystem is initialized.

9. The programmable control device as claimed in claim 6, said processor being capable of controlling an initialization duty cycle for the predistortion subsystem, the initialization duty cycle being determinative of how often the predistortion subsystem is initialized, the initialization duty cycle being dependent on how often the predistortion subsystem updates at least one lookup table.

10. The programmable control device as claimed in claim 6, said processor being capable of controlling the programmable control device to transition from said one of said states to said another of said states based at least in part on input from a distortion monitor that monitors a level of distortion for the predistortion subsystem.

11. The programmable control device as claimed in claim 6, the plurality of states comprising one or more of a reset state, a pause state, a hold state, a warm up state, a standby state, an update state, a full initialization state, a re-initialization state, or a cool down state, or combinations thereof.

12. The programmable control device as claimed in claim 6, the one or more states comprising one or more of a reset state, a measure state, a freeze state, a no monitor state, or a monitor state, or combinations thereof.

13. An article of manufacture, comprising:
   a storage medium having instructions stored thereon which, if executed are capable of causing a programmable control device to control a predistortion subsystem for a transmission system, the programmable control device being programmed to operate in a plurality of states, one or more of the states being associated with one or more commands to be executed by the predistortion subsystem in response to the programmable control device being in an associated state, by:
   processing data relating to a status of the predistortion subsystem;
   storing settings for the programmable control device; and
   responsive to the processed data, transitioning the preprogrammed control device from one of said states to another of said states based at least in part on the stored settings.

14. The article of manufacture as claimed in claim 13, wherein the instructions, if executed, are further capable of causing the programmable control device to control a predistortion subsystem for a transmission system, by:
   controlling an update duty cycle for the predistortion subsystem, the update duty cycle being determinative of how often the predistortion subsystem updates at least one lookup table.

15. The article of manufacture as claimed in claim 13, wherein the instructions, if executed, are further capable of causing the programmable control device to control a predistortion subsystem for a transmission system, by:
controlling an initialization duty cycle for the predistortion subsystem, the initialization duty cycle being determinative of how often the predistortion subsystem is initialized.

16. The article of manufacture as claimed in claim 13, wherein the instructions, if executed, are further capable of causing the programmable control device to control a predistortion subsystem for a transmission system, by:
controlling an initialization duty cycle for the predistortion subsystem, the initialization duty cycle being determinative of how often the predistortion subsystem is initialized, the initialization duty cycle being dependent on how often the predistortion subsystem updates at least one lookup table.

17. The article of manufacture as claimed in claim 13, wherein the instructions, if executed, are further capable of causing the programmable control device to control a predistortion subsystem for a transmission system, by:
causing the programmable control device to transition from said one of said states to said another of said states based at least in part on input from a distortion monitor that monitors a level of distortion for the predistortion subsystem.

18. The article of manufacture as claimed in claim 13, wherein the plurality of states comprise one or more of the following: a reset state, a pause state, a hold state, a warm up state, a standby state, an update state, a full initialization state, a re-initialization state, or a cool down state, or combinations thereof.

19. article of manufacture as claimed in claim 13, wherein the plurality of states comprise one or more of the following: a reset state, a measure state, a freeze state, a no monitor state, or a monitor state, or combinations thereof.

20. An application specific integrated circuit capable of controlling a predistortion subsystem of a transmission system, the application specific integrated circuit being programmable to operate in a plurality of states, one or more of the states being associated with one or more commands to be executed by the predistortion subsystem in response to the application specific integrated circuit being in an associated state, the application specific integrated circuit comprising:
a processor capable of processing data relating to a status of the predistortion subsystem; and
a memory circuit capable of storing settings for the application specific integrated circuit;
wherein, responsive to the processed data, the processor is adapted to cause the application specific integrated circuit to transition from one of said states to another one of said states based at least in part on the settings of said memory circuit.

21. The application specific integrated circuit as claimed in claim 20, wherein said processor controls an update duty cycle for the predistortion subsystem, the update duty cycle being determinative of how often the predistortion subsystem updates at least one lookup table.

22. The application specific integrated circuit as claimed in claim 20, wherein said processor controls an initialization duty cycle for the predistortion subsystem, the initialization duty cycle being determinative of how often the predistortion subsystem is initialized.

23. The application specific integrated circuit as claimed in claim 20, wherein said processor controls an initialization duty cycle for the predistortion subsystem, the initialization duty cycle being determinative of how often the predistortion subsystem is initialized, the initialization duty cycle being dependent on how often the predistortion subsystem updates at least one lookup table.

24. The application specific integrated circuit as claimed in claim 20, wherein said application processor causes the application specific integrated circuit to transition from said one of said states to said another of said states based at least in part on input from a distortion monitor that monitors a level of distortion for the predistortion subsystem.

25. The application specific integrated circuit as claimed in claim 20, wherein the plurality of states comprise one or more of the following: a reset state, a pause state, a hold state, a warm up state, a standby state, an update state, a full initialization state, a re-initialization state, or a cool down state, or combinations thereof.

26. The application specific integrated circuit as claimed in claim 20, wherein the plurality of states comprise one or more of the following: a reset state, a measure state, a freeze state, a no monitor state, or a monitor state, or combinations thereof.

27. A combinational logic circuit capable of controlling a predistortion subsystem of a transmission system, the combinational logic circuit being programmable to operate in a plurality of states, one or more of the states being associated with one or more commands to be executed by the predistortion subsystem in response to the combinational logic circuit being in an associated state, the combinational logic circuit comprising:
a first logic circuit capable of processing data relating to a status of the predistortion subsystem; and
a second logic circuit capable of storing settings for the combinational logic circuit;
wherein, responsive to the processed data, the first logic circuit is adapted to cause the combinational logic circuit to transition from one of said states to another one of said states based at least in part on the settings of said second logic circuit.

28. The combinational logic circuit as claimed in claim 27, wherein said first logic circuit controls an update duty cycle for the predistortion subsystem, the update duty cycle being determinative of how often the predistortion subsystem updates at least one lookup table.

29. The combinational logic circuit as claimed in claim 27, wherein said first logic circuit controls an initialization duty cycle for the predistortion subsystem, the initialization duty cycle being determinative of how often the predistortion subsystem is initialized.

30. The combinational logic circuit as claimed in claim 27, wherein said first logic circuit controls an initialization duty cycle for the predistortion subsystem, the initialization duty cycle being determinative of how often the predistortion subsystem is initialized, the initialization duty cycle being dependent on how often the predistortion subsystem updates at least one lookup table.

31. The combinational logic circuit as claimed in claim 27, wherein said first logic circuit causes the application specific integrated circuit to transition from said one of said states to said another of said states based at least in part on input from a distortion monitor that monitors a level of distortion for the predistortion subsystem.

32. The combinational logic circuit as claimed in claim 27, wherein the plurality of states comprise one or more of the following: a reset state, a pause state, a hold state, a warm up state, a standby state, an update state, a full initialization state, a re-initialization state, or a cool down state, or combinations thereof.

33. The combinational logic circuit as claimed in claim 27, wherein the plurality of states comprise one or more of the following: a reset state, a measure state, a freeze state, a no monitor state, or a monitor state, or combinations thereof.

34. The control device according to claim 1, wherein said control device is further adapted to transition to said second state by initiating execution of at least one of said sets of commands associated with said second state.

35. The programmable control device according to claim 6, wherein said control device is further adapted to transition to said another of said states by initiating execution of at least one of said sets of commands associated with said another of said states.

36. The article of manufacture according to claim 13, wherein said transitioning the preprogrammed control device to said another of said states comprises initiating execution of at least one of said sets of commands associated with said another of said states.

* * * * *